(12) United States Patent
Kikuchi et al.

(10) Patent No.: US 10,178,333 B2
(45) Date of Patent: Jan. 8, 2019

(54) IMAGE SENSOR AND IMAGING DEVICE

(71) Applicant: OLYMPUS CORPORATION, Hachioji-shi, Tokyo (JP)

(72) Inventors: Tetsuo Kikuchi, Hachioji (JP); Atsuro Okazawa, Hino (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 15/905,816

(22) Filed: Feb. 26, 2018

(65) Prior Publication Data

US 2018/0191976 A1 Jul. 5, 2018

Related U.S. Application Data

(63) Continuation of application No. 15/382,893, filed on Dec. 19, 2016, now Pat. No. 9,942,500, which is a continuation of application No. PCT/JP2015/059036, filed on Mar. 25, 2015.

(30) Foreign Application Priority Data

Jun. 24, 2014 (JP) ................................. 2014-129326

(51) Int. Cl.
*H04N 5/369* (2011.01)
*G02B 7/34* (2006.01)
*H01L 27/146* (2006.01)
*H04N 5/378* (2011.01)
*H04N 9/04* (2006.01)
*H04N 5/232* (2006.01)

(52) U.S. Cl.
CPC ............. *H04N 5/3696* (2013.01); *G02B 7/34* (2013.01); *H01L 27/14621* (2013.01); *H01L 27/14623* (2013.01); *H04N 5/23212* (2013.01); *H04N 5/378* (2013.01); *H04N 9/045* (2013.01); *H01L 27/14645* (2013.01)

(58) Field of Classification Search
CPC ................ G02B 7/34; H01L 27/14621; H01L 27/14623; H01L 27/14645; H04N 5/23212; H04N 5/3696; H04N 5/378; H04N 9/045
See application file for complete search history.

(56) References Cited

U.S. PATENT DOCUMENTS

2009/0213255 A1* 8/2009 Suzuki .............. H01L 27/14623
348/302
2010/0302432 A1* 12/2010 Komuro ............. H04N 5/23212
348/340
2011/0096189 A1* 4/2011 Taniguchi ................ G02B 7/34
348/222.1

(Continued)

*Primary Examiner* — Amy Hsu
(74) *Attorney, Agent, or Firm* — John C. Pokotylo; Pokotylo Patent Services

(57) ABSTRACT

An image sensor comprising a plurality of imaging pixels, a plurality of focus detecting pixels in which opening positions of light receiving sections are shifted from those of the imaging pixels, and a plurality of color filters arranged corresponding to the imaging pixels and the focus detecting pixels, wherein first focus detecting pixels in which opening positions are shifted in a first direction are arranged at positions corresponding to first color filters of the imaging pixels, and second focus detecting pixels in which opening positions are shifted in the first direction and which have opening ratios different from those of the first focus detecting pixels are arranged at positions corresponding to the first color filters.

10 Claims, 9 Drawing Sheets

(56) References Cited

U.S. PATENT DOCUMENTS

| | | | | |
|---|---|---|---|---|
| 2011/0273602 A1* | 11/2011 | Takamiya | .......... | H04N 5/23212 |
| | | | | 348/302 |
| 2012/0138773 A1* | 6/2012 | Taniguchi | .......... | H04N 5/23212 |
| | | | | 250/208.1 |
| 2012/0299066 A1* | 11/2012 | Kato | ................. | H01L 27/14612 |
| | | | | 257/222 |
| 2014/0218594 A1* | 8/2014 | Hirose | ..................... | G02B 7/34 |
| | | | | 348/349 |
| 2017/0104943 A1* | 4/2017 | Toyoda | .................... | G02B 7/28 |

* cited by examiner

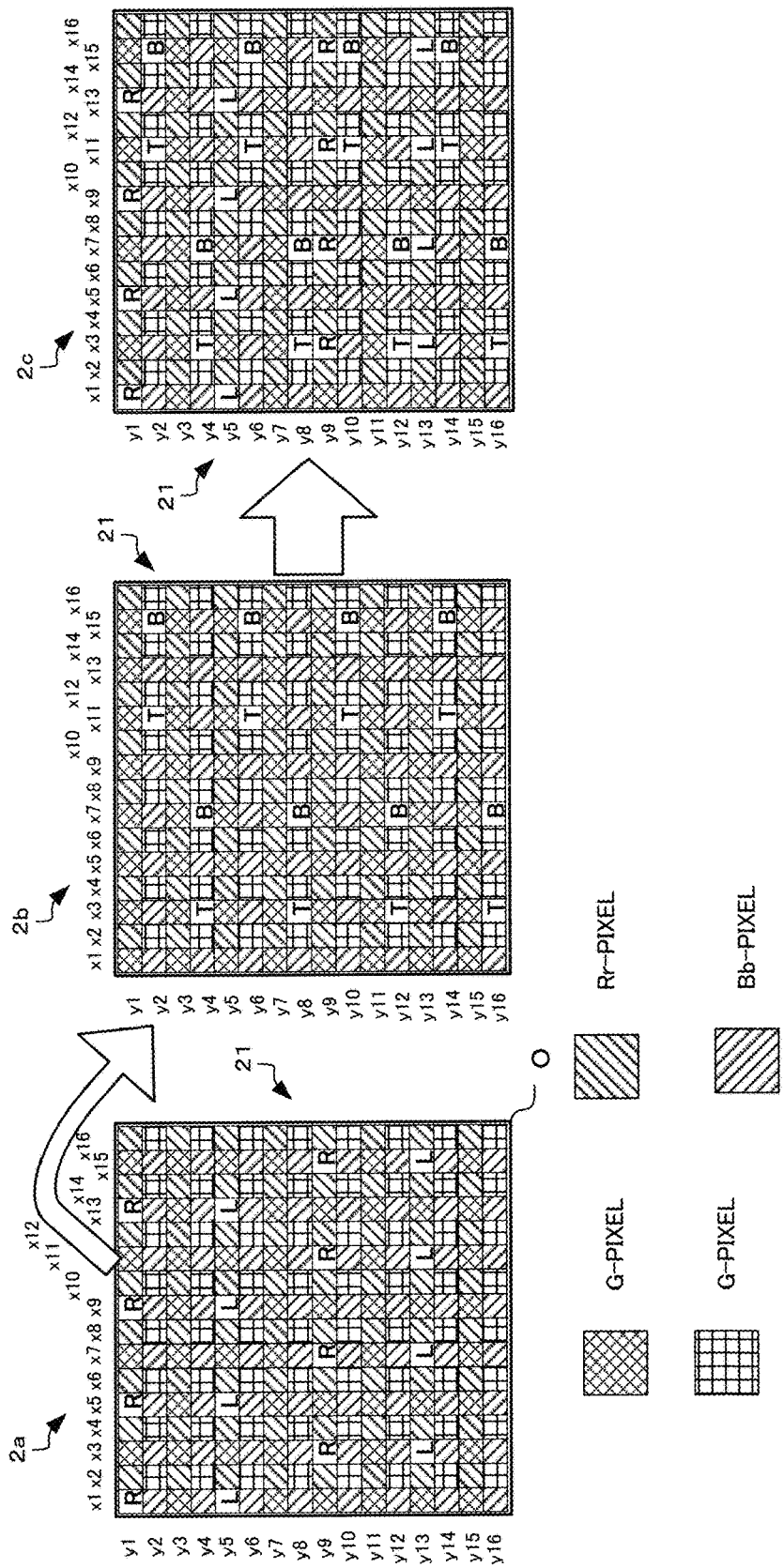

IMAGE SENSOR AND IMAGING DEVICE

CROSS-REFERENCE TO RELATED APPLICATIONS

This application is a continuation application of U.S. patent application Ser. No. 15/382,893 (referred to as "the '893 application" and incorporated herein by reference), filed on Dec. 19, 2016, titled "IMAGE SENSOR AND IMAGING DEVICE" and listing Tetsuo KIKUCHI and Atsuro OKAZAWA as the inventors, the '893 application being a continuation application of PCT Application No. PCT/JP2015/059036, filed on Mar. 25, 2015, which is based upon and which claims benefit of Japanese Application No. 2014-129326 filed in Japan on Jun. 24, 2014, the contents of which are incorporated by this reference.

BACKGROUND OF THE INVENTION

1. Field of the Invention

The present invention relates to an image sensor in which focus detecting pixels are arranged on an imaging plane for performing focus detection by a phase difference method, and to an imaging device including this image sensor.

2. Description of the Related Art

There is conventionally known an image sensor in which focus detecting pixels are arranged at a part of the image sensor for performing focus detection by a phase difference method. For example, Japanese Patent Laid-Open No. 2013-257494 (hereafter referred to as "Patent Literature 1") discloses an image sensor in which a right opening pixel (called R-pixel in abbreviation) to cause a subject light flux from the right side to enter the pixel and a left opening pixel (called L-pixel in abbreviation) to cause a subject light flux from the left side to enter the pixel are arranged in the horizontal direction as focus detecting pixels.

In Patent Literature 1, each of the focus detecting pixels has only one kind of characteristic in a light shielding pattern, and therefore the light shielding pattern is designed so as to obtain a high focusing accuracy near a focusing point. However, when the position of a photographing lens is significantly deviated from the focusing position, that is, in a largely-defocused state (also called a largely blurred state), the brightness pattern of a subject image is not clear and a defocus amount cannot be detected. In particular, this problem is more frequently caused for a fast photographing lens having a small aperture F-value.

If the aperture of the photographing lens is stopped down during AF operation, while the brightness pattern of the subject image can be made clear, the aperture drive takes time and an AF time becomes longer. Further, a method can be considered which solves the above problem by arranging a light shielding pattern of a focus detecting pixel for detecting the largely-defocused state and a light shielding pattern of a focus detecting pixel for detecting the vicinity of the focusing point. However, in the arrangement of the focus detecting pixels having a plurality of light shielding patterns, it is difficult to ensure an image quality performance. In particular, when the plurality of light shielding patterns is arranged for the focus detecting pixels arranged at the positions of G-pixels (pixels where green filters are arranged), correction processing of the focus detecting pixels cannot be performed.

SUMMARY OF THE INVENTION

The present invention is achieved in view of such a situation, and aims to provide an image sensor and an imaging device capable of quick focus detection even in a largely-defocused state while ensuring an image quality performance.

An imaging device according to a first aspect of the present invention includes a plurality of imaging pixels, a plurality of focus detecting pixels in which opening positions of light receiving sections are shifted from those of the imaging pixels, and a plurality of color filters arranged corresponding to the imaging pixels and the focus detecting pixels, wherein first focus detecting pixels in which opening positions are shifted in a first direction are arranged at positions corresponding to first color filters of the imaging pixels, second focus detecting pixels in which opening positions are shifted in the first direction and which have opening ratios different from those of the first focus detecting pixels are arranged at positions corresponding to the first color filters, third focus detecting pixels and fourth focus detecting pixels in which opening positions are shifted in a second direction perpendicular to the first direction and which have opening positions different from each other are arranged at positions corresponding to second color filters different from the first color filters of the imaging pixels.

An imaging device according to a second aspect of the present invention includes an image sensor having a plurality of imaging pixels, and a plurality of focus detecting pixels in which opening positions of light receiving sections are shifted from those of the imaging pixels, the imaging device including a focus detection region setting section to set a focus detection region in a photographing screen, wherein, in the image sensor, first focus detecting pixels in which opening positions are shifted in a first direction are arranged at positions correspond to first color filters of the imaging pixels, second focus detecting pixels in which opening positions are shifted in the first direction and which have opening ratios different from those of the first focus detecting pixels are arranged at positions corresponding to the first color filters, third focus detecting pixels and fourth focus detecting pixels in which opening positions are shifted in a second direction perpendicular to the first direction and which have opening positions different from each other are arranged at positions corresponding to second color filters different from the first color filters of the imaging pixels, the focus detection region setting section sets positions where the second focus detecting pixels are arranged to be near boundaries of the focus detection regions, and the second focus detecting pixels are not arranged in a region of the image sensor corresponding to the focus detection region.

BRIEF DESCRIPTION OF THE DRAWINGS

FIG. 2 is a plan view showing an arrangement relationship between RL-pixels and BT-pixels in an image sensor according to an embodiment of the present invention.

DETAILED DESCRIPTION OF THE PREFERRED EMBODIMENTS

Hereinafter, there will be explained an example of application to an image sensor as an embodiment of the present invention. In an outline, the image sensor according to the present embodiment has an image plane phase difference AF function of a pixel light-shielding type, and horizontal pixel lines (RL-pixel lines) are arranged at an interval not smaller than four pixel pitches (in detail, refer to FIG. 1 and the like) and further vertical pixel lines (TB-pixel lines) are arranged also at an interval not smaller than four pixel pitches. The TB-pixel lines are arranged at the interval obtained by rotating the RL-pixel lines by just 90 degrees (in detail, refer to 2b in FIG. 2).

Further, focus detecting pixels arranged at the positions of pixels other than G-pixels (refer to Bb-pixels or Rr-pixels shown in FIGS. 1 to 3E, for example), have two or more different kinds of light shielding ratios (in detail, refer to FIGS. 3A to 3E, FIGS. 4A and 4B, and the like). Out of the two kinds of light shielding ratios, one light shielding ratio is that of a pixel for ensuring a performance near a focusing point, and the other one is that of a pixel for detecting a defocus amount in a largely-defocused state. Further, the focus detecting pixels are arranged on the entire surface of an effective region in the imaging plane, the focus detecting pixels are arranged in the same pitch, and some pixels thereof are used as pixels for large defocus (T2-pixels and B2-pixels) and arranged in a line shape (in detail, refer to FIG. 3E, FIGS. 7A and 7B, and the like).

Further, AF pixel lines where the focus detecting pixels for the large defocus (refer to T2-pixels and B2-pixels of FIG. 3C, for example) are arranged are controlled to be skipped and read out in mixing readout (refer to FIG. 6 for mixing readout). The focus detecting pixels for the large defocus (refer to T2-pixels and B2-pixels) are arranged in the gaps or near the boundaries of AF range-finding areas (in detail, refer to FIGS. 7A and 7B). The focus detecting pixels for the large defocus are arranged densely near the center of the screen, and further arranged also on the outer side of the screen (in detail, refer to FIGS. 7A and 7B). The focus detecting pixels for the large defocus are arranged for the focus detecting pixels except the G-pixels.

Figure 1:
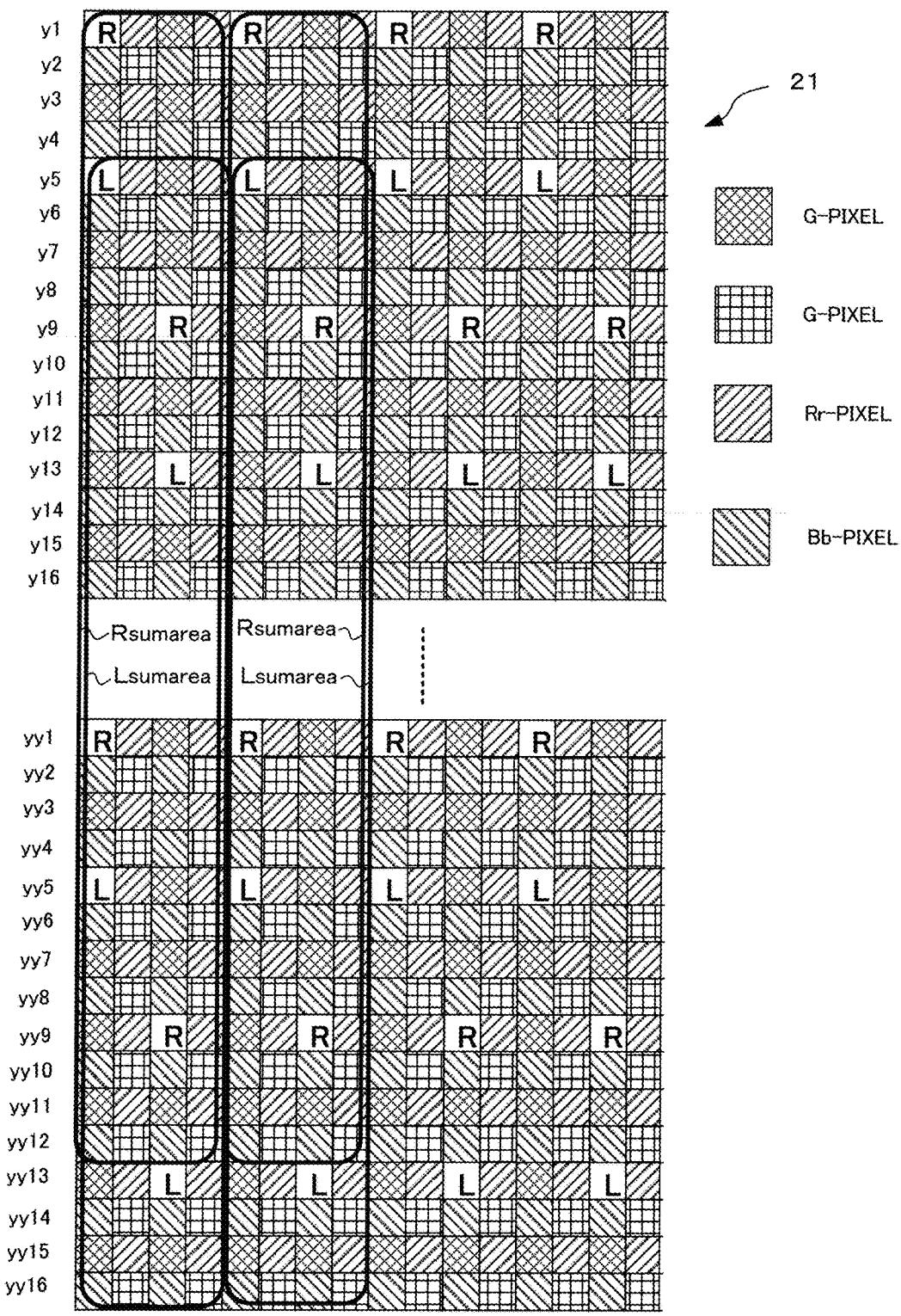
FIG. 1 is a plan view showing a pixel arrangement of an image sensor according to an embodiment of the present invention.

FIG. 1 shows an arrangement of imaging pixels and focus detecting pixels in an image sensor 21. FIG. 1 shows an example of arranging the focus detecting pixels each having an opening on the right side (R-pixels) and the focus detecting pixels each having an opening on the left side (L-pixels) at an interval of four pixel pitches in the lateral direction (horizontal direction). Here, the pixel interval, while being four pixel pitches in FIG. 1, may be not smaller than four pixel pitches. This is because it becomes difficult to keep an image quality performance when the focus detecting pixels are arranged at an interval smaller than four pixel pitches.

In FIG. 1, the R-pixels or the L-pixels are arranged at some of positions where G-pixels (imaging pixels having G-filters) are arranged in the case of a normal Bayer arrangement image sensor which does not include the focus detecting pixels. When the R-pixels or the L-pixels are not arranged, two G-pixels (imaging pixels where green filters are arranged) are arranged diagonally in a range of 2×2 pixels, and one Bb-pixel (imaging pixel where a blue filter is arranged) and one Rr-pixel (imaging pixel where a red filter is arranged) are arranged at other diagonal positions.

Then, in FIG. 1, the R-pixels are arranged at positions (x1, y1), (x5, y1), (x9, y1), (x13, y1), . . . , (x3, y9), (x7, y9), (x11, y9), (x15, y9), . . . , and the L-pixels are arranged at positions (x1, y5), (x5, y5), (x9, y5), (x13, y5), . . . , (x3, y13), (x7, y13), (x11, y13), (x15, y13), . . . , where the G-pixels are arranged in the case of a normal Bayer arrangement image sensor which does not include the focus detecting pixels. In this manner, the R-pixels and the L-pixels are arranged at some of positions where G-pixels are arranged in the image sensor which does not include the focus detecting pixels, in the lateral direction (horizontal direction) every four pixels.

Further, in the focus detection, while a phase difference may be calculated by the use of each one pixel of the respective pixels in the R-pixels and the L-pixels, in the present embodiment, the outputs of the R-pixels are added in a predetermined range (in Rsumarea) of the image sensor 21 in the longitudinal direction (vertical direction), and are treated as image data of one pixel. Similarly, the outputs of the L-pixels are added in a predetermined range (in Lsumarea) of the image sensor 21 in the longitudinal direction (vertical direction), and are treated as image data of one pixel. The phase difference is calculated from changes in the lateral direction (horizontal direction) between the added value of the R-pixels and the added value of the L-pixels in the predetermined ranges.

Further, in the predetermined ranges (Rsumarea and Lsumarea), the R-pixels at positions different in the y-direction are arranged at positions shifted by two pixels in the x-direction. That is, the R-pixels are arranged also at the positions (x3, y9), (x7, y9), . . . , shifted by two pixels in the lateral direction from the R-pixels arranged at the positions (x1, y1), (x5, y1), . . . . This is for ensuring an AF accuracy by means of arranging the focus detecting pixels more densely with respect to a sampling pitch (four pixels in the example of FIG. 1). The L-pixels are also arranged similarly.

Next, the arrangement of the T-pixels and the B-pixels will be explained by the use of FIG. 2. An image sensor 2a in FIG. 2 shows the same pixel arrangement as one shown in FIG. 1. When this image sensor 2a in FIG. 2 is rotated clockwise by 90 degrees centering the right bottom corner O and the B-pixels and the T-pixels are arranged at the positions of the Bb-pixels, the pixel arrangement of an image sensor 2b in FIG. 2 is obtained. Then, the R-pixels and the L-pixels shown in the image sensor 2a in FIG. 2 and the T-pixels and the B-pixels shown in the image sensor 2b in FIG. 2 are overlapped, and thereby the pixel arrangement of RL-pixels (abbreviated name indicating both of the R-pixels and the L-pixels) and TB-pixels (abbreviated name indicating both of the T-pixels and the B-pixels) is obtained as shown in an image sensor 2c in FIG. 2.

For example, when the R-pixel at the position (x1, y1) is rotated by 90 degrees centering on the position O (position (x16, y1)) and moved by one pixel amount in the lower left diagonal direction to correspond to the Bb-pixel in the arrangement of the image sensor 2a in FIG. 2, a position (x15, y2) is obtained and the B-pixel is arranged at this position. Further, the L-pixel at the position (x1, y5) is rotated by 90 degrees centering on the position O (position (x12, y1)), and moved by one pixel amount in the lower left diagonal direction to correspond to the Bb-pixel in the arrangement of the image sensor 2a in FIG. 2, a position (x11, y2) is obtained and the T-pixel is arranged at this position.

In this manner, in the pixel arrangement (shown in the image sensor 2c in FIG. 2) of the present embodiment, horizontal pixel lines of the RL-pixels are arranged at an interval of not smaller than four pixel pitches, and further vertical pixel lines of the TB-pixels have the same pixel pitch as the RL-pixel lines and are arranged at the interval obtained by rotating the RL-pixel lines by just degrees. Further, the TB-pixel is located at the original position of the Bb-pixel, and the blue filter is replaced by a green or transparent filter.

Figure 3A:
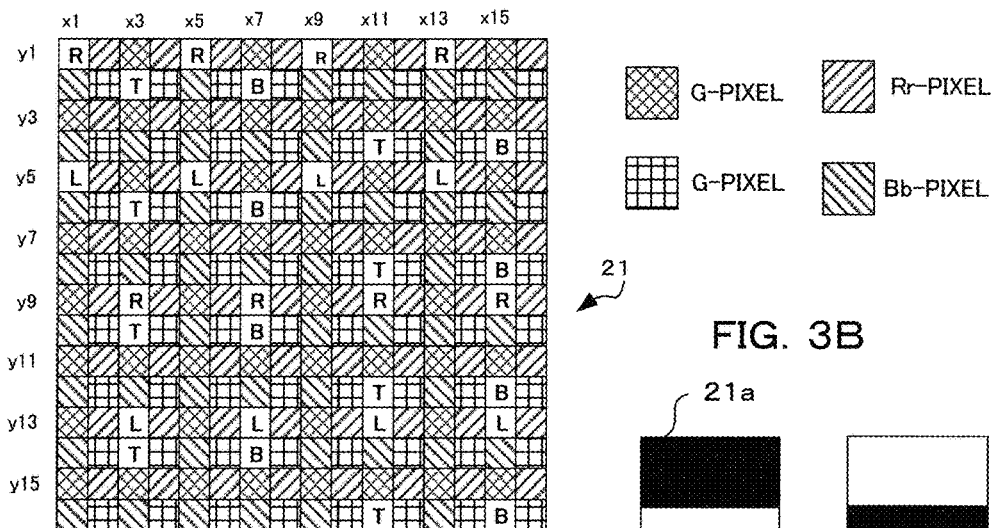
FIGS. 3A to 3E are diagrams showing arrangements and opening part shapes of normal focus detecting pixels and focus detecting pixels for a largely-defocused state in an image sensor according to an embodiment of the present invention.

Next, by the use of FIG. 3A to 3E, the focus detecting pixels used normally and the focus detecting pixels used in the largely-defocused state will be explained. FIG. 3A shows an arrangement of the focus detecting pixels (RL-pixels and TB-pixels) used normally. While the arrangement of the normal focus detecting pixels shown in FIG. 3A is substantially the same as the pixel arrangement shown in the image sensor 2c in FIG. 2, the coordinate system is changed for the convenience of explanation. The correspondence of the coordinates between the image sensor 21 in FIG. 3A and the image sensor 2c in FIG. 2 is as follows. When the correspondence from the image sensor 21 in FIG. 3A to the image sensor 2c in FIG. 2 is expressed by →, the correspondences are (x1, y1)→(x9, y1), (x1, y16)→(x9, y16), (x8, y1)→(x16, y1), and (x8, y16)→(x16, y16).

Figure 3B:
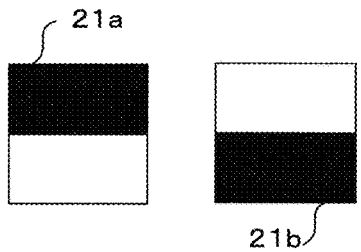

FIG. 3B shows shapes of light shielding members for the T-pixel and the B-pixel in the normal focus detecting pixels. The light shielding member 21a shows an opening shape (light shielding shape) of the B-pixel. That is, the light shielding member 21a shields a subject light flux from the upper side for causing a subject light flux from the lower side to enter the focus detecting pixel (B-pixel). On the other hand, the light shielding member 21b shown in FIG. 3B shows an opening shape (light shielding shape) of the T-pixel. That is, the light shielding member 21b shields a subject light flux from the lower side for causing a subject light flux from the upper side to enter the focus detecting pixel (T-pixel).

Figure 3C:
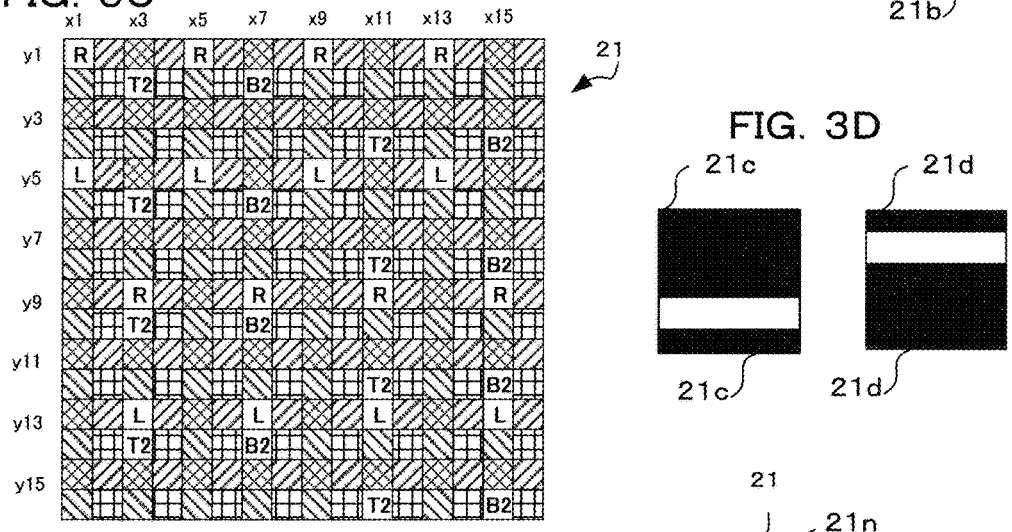

FIG. 3C shows an arrangement of the focus detecting pixels used in the largely-defocused state (RL-pixels, T2-pixels, and B2-pixels). The arrangement of the focus detecting pixels used in the largely-defocused state in FIG. 3C is the same as that shown in FIG. 3A for the RL-pixels. However, the B2-pixels and the T2-pixels are arranged at positions of the B-pixels and the T-pixels in FIG. 3A as shown in FIG. 3C.

Figure 3D:
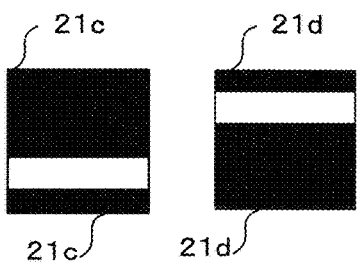

FIG. 3D shows opening shapes of the T2-pixel and the B2-pixel which are the focus detecting pixels used in the largely-defocused state. The light shielding member 21c shows the opening shape (light shielding shape) of the B2-pixel. That is, the light shielding member 21c shields a subject light flux from the upper side and a subject light flux apart from the optical axis from the lower side for causing a subject light flux travelling near the optical axis center from the lower side to enter the focus detecting pixel (B2-pixel). As shown in the drawing, light shielding sections are provided for the upper half part and a part of the lower side. The sensitivity characteristics of the B2-pixel with this light shielding member 21c will be described below by the use of FIGS. 4A and 4B.

On the other hand, the light shielding member 21d shown in FIG. 3D shows the opening shape (light shielding shape) of the T2-pixel. That is, the light shielding member 21d shields a subject light flux from the lower side and a subject light flux apart from the optical axis from the upper side for causing a subject light flux travelling near the optical axis center from the upper side to enter the focus detecting pixel (T2-pixel). As shown in the drawing, light shielding sections are provided for the lower half part and a part of the upper side. The sensitivity characteristics of the T2-pixel with this light shielding member 21d will be described below by the use of FIGS. 4A and 4B.

Figure 3E:
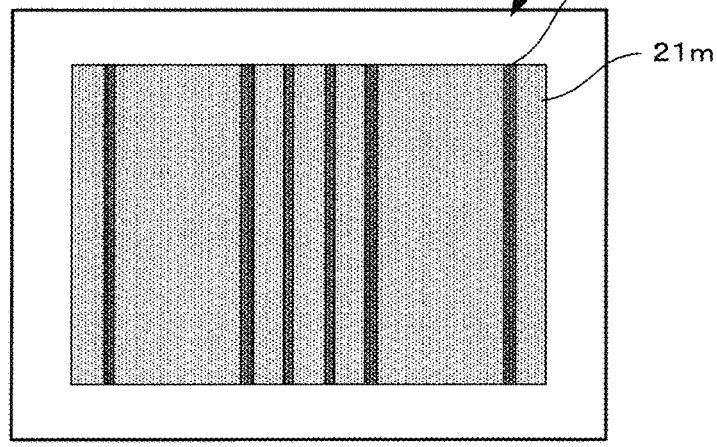

FIG. 3E shows a region where the focus detecting pixels (RL-pixel and TB-pixel) for the normal state are arranged and a region where the focus detecting pixels for the largely-defocused state detection (RL-pixels, T2-pixels, and B2-pixels) are arranged. That is, FIG. 3E shows the entire region of the imaging plane of the image sensor 21. Then, in the region 21m, the focus detecting pixels for the normal state where TB-pixels are arranged in vertical pixel lines are arranged. Further, in the region 21n, the focus detecting pixels for the large defocus are arranged including the T2-pixels and the B2-pixels arranged in vertical pixel lines (six lines in the example of FIG. 3E). Note that the relationship between the region 21n where the focus detecting pixels are arranged and the AF range-finding areas will be described below by the use of FIGS. 7A and 7B.

In the present embodiment, the focus detecting pixel for the normal state (T-pixel and B-pixel) and the focus detecting pixels for the largely-defocused state (T2-pixels and B2-pixels) are arranged in the same pitch and at the same interval. Accordingly, as will be described below, skipping is easily performed in the mixing readout from the image sensor 21. Further, the focus detecting pixels for the largely-defocused state (T2-pixel and B2-pixels) are arranged densely near approximately the center of the imaging plane of the image sensor 21 and arranged sparsely in the peripheral part. This is because, as will be described below, generally the AF regions are concentrated near the center of the photographing screen when the image sensor 21 is assembled in an imaging device, and it is possible to increase the degree of coincidence with the AF regions by arranging the focus detecting pixels for the largely-defocused state (T2-pixels and B2-pixels) in the center part more densely than in the peripheral part.

Figure 4A:
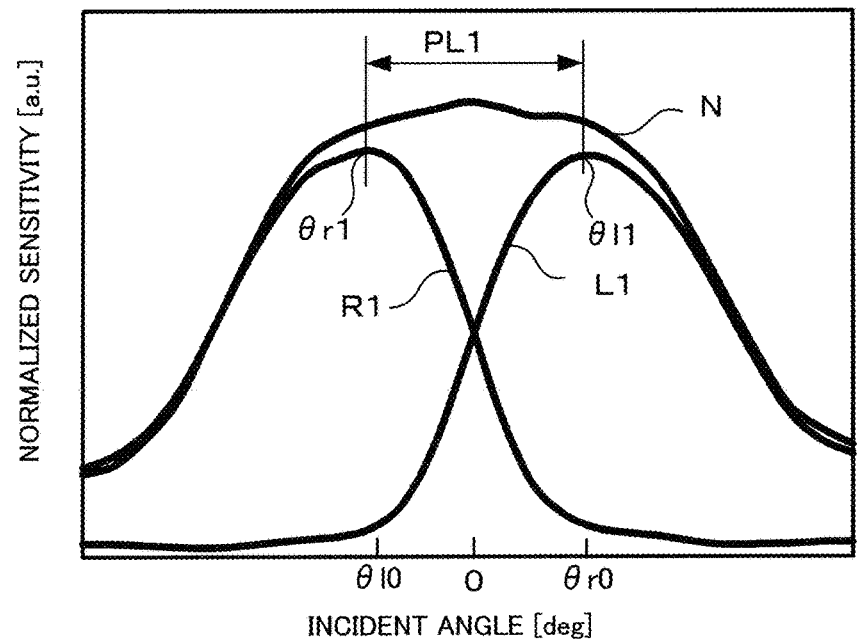
FIGS. 4A and 4B are graphs showing characteristics of a focus detecting pixel of an image sensor according to an embodiment of the present invention.

Next, by the use of FIGS. 4A and 4B, the characteristics of the focus detecting pixel for the normal state (R-pixel and L-pixel) and the focus detecting pixel for the largely-defocused state (T2-pixel and B2-pixel) will be explained. First, FIG. 4A shows the sensitivity change of the normal imaging pixel and the sensitivity changes of the focus detecting pixels (R-pixel and L-pixel). In this graph, the horizontal axis indicates an incident angle of a subject light flux, and incident angle of zero degrees indicates an incident angle perpendicular to the imaging plane. Further, the vertical axis indicates a normalized sensitivity (a.u.: arbitrary unit).

As apparent from FIG. 4A, the sensitivity N of the normal imaging pixel has sensitivity across the whole incident angle region, and has approximately left-right symmetry centering on zero degrees of the incident angle. Further, the sensitivity R1 of the R-pixel which is the focus detecting pixel has sensitivity on the minus side of the incident angle, and has the maximum value of the sensitivity near an incident angle θr1. Further, the difference from the sensitivity N of the imaging pixel is small on the minus side from the angle where the R-pixel has the maximum sensitivity value. Furthermore, the sensitivity of the R-pixel is small on the plus side of the incident angle and the sensitivity is assumed to have the minimum value at angles larger than an incident angle θr0.

Further, the sensitivity L1 of the L-pixel which is the focus detecting pixel has sensitivity on the plus side of the incident angle, and has the maximum value of the sensitivity near an incident angle θl1. Further, the difference from the sensitivity N of the imaging pixel is small on the plus side from the angle where the L-pixel has the maximum sensitivity value. Furthermore, the sensitivity of the L-pixel is small on the minus side of the incident angle and the sensitivity is assumed to have the minimum value at an angle smaller than an incident angle θl0.

In this manner, the sensitivity characteristics of the R-pixel and the L-pixel have left-right symmetry in a range PL1 between the sensitivity peaks of the R-pixel and the L-pixel centering on an incident angle near zero degrees. Further, the sensitivity values cross each other near zero degrees of the incident angle, and, in the example of FIG. 4A, the sensitivity value at the angle of the cross point is approximately 0.5 and the absolute values of the gradients in both of the sensitivities near the cross point are approximately equal to each other.

Figure 4B:
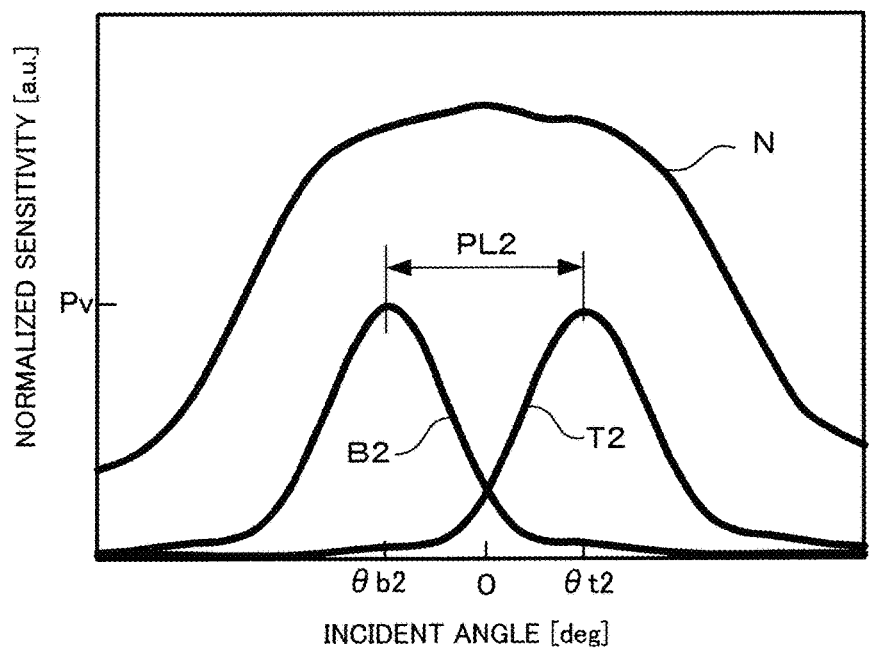

FIG. 4B shows the sensitivity change of the normal imaging pixel and the sensitivity changes of the focus detecting pixels for the largely-defocused state (T2-pixel and B2-pixel). Also in this graph, as in FIG. 4A, the horizontal axis indicates an incident angle of a subject light flux, and the incident angle of zero degrees indicates approximately the center of the pixels. Further, the vertical axis indicates a normalized sensitivity (a.u.: arbitrary unit).

Also in FIG. 4B, the sensitivity N of the normal imaging pixel exhibits the same shape as in FIG. 4A. The sensitivity B2 of the B2-pixel which is the focus detecting pixel for the largely-defocused state has sensitivity on the minus side of the incident angle, and has a peak value near an incident angle θb2. Further, the sensitivity T2 of the T2-pixel which is the focus detecting pixel for the largely-defocused state has sensitivity on the plus side of the incident angle, and has a peak value near an incident angle θt2 and the peak value is approximately the same as that of the B2-pixel.

In this manner, the sensitivity characteristics of the B2-pixel and the T2-pixel have left-right symmetry in a range PL2 between the sensitivity peaks of the B2-pixel and the T2-pixel centering on the vicinity of zero degrees of the incident angle. Further, the sensitivity values in both of the pixels cross each other near zero degrees of the incident angle, and, in the example of FIG. 4B, the sensitivity value at the cross point is smaller than 0.5, and the sensitivity at an angle of the cross point is lower than that for the normal state. Further, the absolute values of the gradients in both of the sensitivities near the cross point are approximately equal to each other and the angle thereof is smaller than that for the normal state.

Accordingly, for the largely-defocused state, compared with the normal state, the angular range between the peaks becomes small, the peak sensitivity value becomes low, the sensitivity value at the cross point angle also becomes low, and further the gradient at the cross point angel also becomes small. Therefore, even for the largely-defocused state, by the use of signals from the T2-pixel and the B2-pixel, a difference is easily caused between the subject light flux from the upper side and the subject light flux from the lower side and the defocus amount can be calculated.

Figure 5:
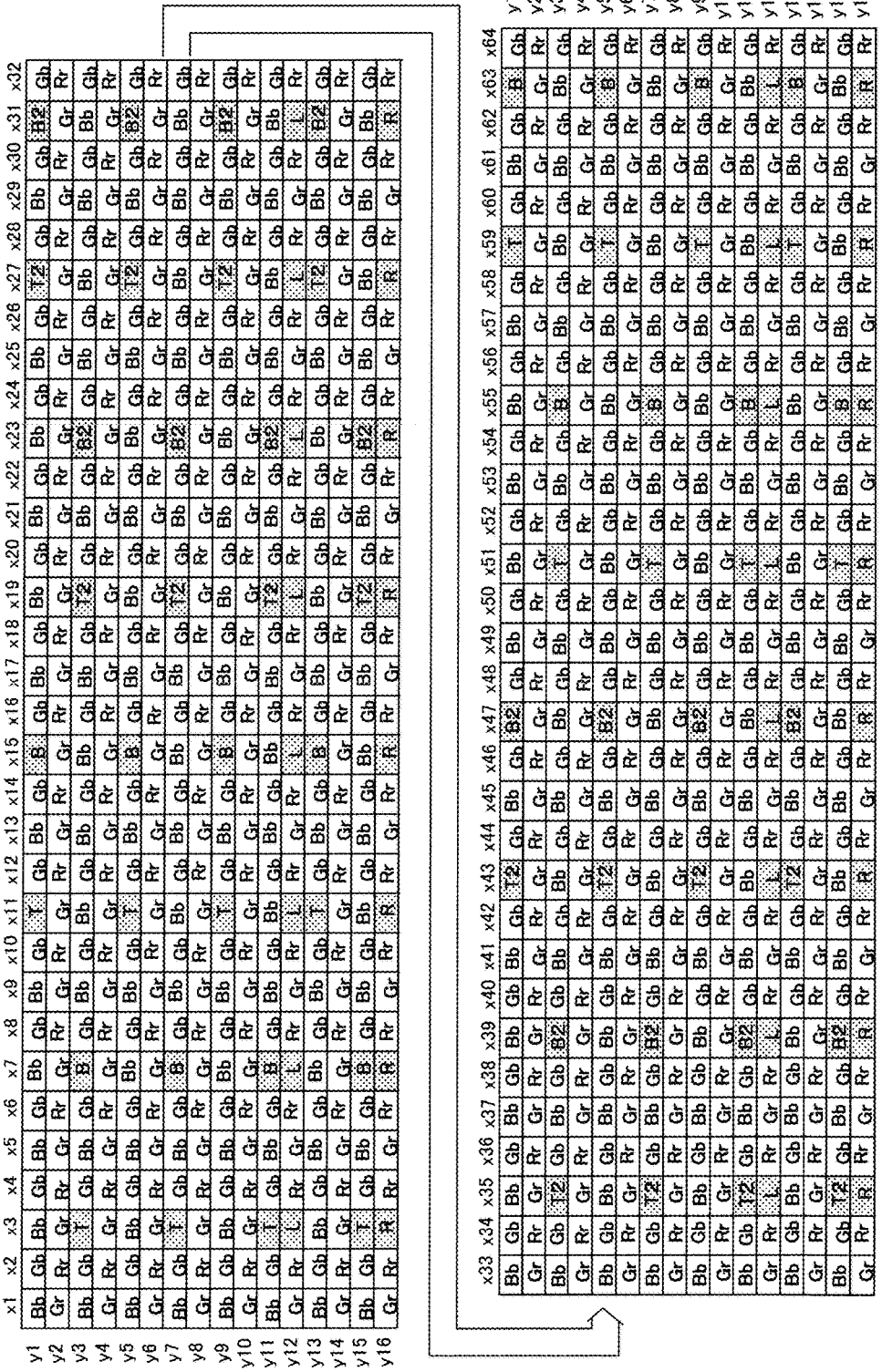
FIG. 5 is a diagram showing a pixel arrangement in an image sensor in an embodiment of the present invention.

Next, by the use of FIG. 5, an example of the arrangement of the imaging pixels and the focus detecting pixels (R-pixels, L-pixels, T-pixels, B-pixels, T2-pixels, and B2-pixels) in the present embodiment will be shown. The example of FIG. 5 shows an arrangement example of 16 pixels in the longitudinal direction (vertical direction) and 64 pixels in the lateral direction (horizontal direction) (in the example of FIG. 5, the right end of the upper part and the left end of the lower part are connected but described to be divided up and down due to limitations of space). As explained by the use of FIG. 3E, the focus detecting pixels are arranged on the surface across the whole screen in the same pitch (four pixel pitches in the example of FIG. 5), and the pixels for the large defocus (T2-pixels and B2-pixels) are arranged on lines replacing some pixels thereof (T-pixels and B-pixels).

That is, in the example shown in FIG. 5, the T-pixel and the B-pixel are arranged, for example, in columns four pixels apart from each other; the x3 column and the x7 column, the x11 column and the x15 column, the x51 column and the x55 column, and the x59 column and the x63 column. Further, T2-pixel and the B2-pixel are arranged in columns four pixels apart from each other; the x19 column and the x23 column, the x27 column and the x31 column, the x35 column and the x39 column, and the x43 column and the x47 column. The T2-pixels and the B2-pixels arranged in the vertical direction shown in FIG. 5 are provided in a plurality of columns, and the plurality of pixel columns is arranged in one region within the regions 21$n$ shown in FIG. 3E.

Next, readout of the focus detecting pixels will be explained. Since the focus detecting pixel has characteristics different from those of the normal imaging pixel in the following two points, correction processing is performed for ensuring an image quality of a still image.

(i) Since the focus detecting pixel shields light in approximately 30% to 80% compared with the normal imaging pixel, the light amount is different from that of the imaging pixel (light amount is reduced in approximately 30% to 80%).

(ii) When an unfocused subject image enters the image sensor plane, phase shift occurs (while a defocus amount is detected by the use of this characteristic, the phase shift is a problem from the viewpoint of image quality).

Basically, correction processing of the above two different characteristics is necessary for the RL-pixel and the TB-pixel. This correction method is described in detail in Japanese Patent Laid-Open No. 2013-257494 and Japanese Patent Laid-Open No. 2013-106124, explanation will be omitted here.

While the correction processing is performed for the image data in still image photographing as described above, the mixing readout is performed in image data readout during live-view display or moving image recording, and processing different from that in the case of the still image photographing is performed. This mixing readout will be explained by the use of FIG. 6.

As described above, in the present embodiment, the TB-pixels are arranged at the positions of the Bb-pixels in the case of the image sensor not including the focus detecting pixels. In the mixing readout, the readout is performed while skipping the TB-pixels of the focus detecting pixels. This is because, since the Bb-pixel has a high contribution level as color information but a low contribution level as brightness information, even when a part of Bb-pixel information lacks, a sufficient image quality is obtained in the case of a moving image. In this manner, while the RL-pixels are targets of the mixing readout, the TB-pixels are skipped in the pixel readout, and thereby it is possible to ensure an image quality of a moving image without performing complicated correction processing.

Figure 6A:
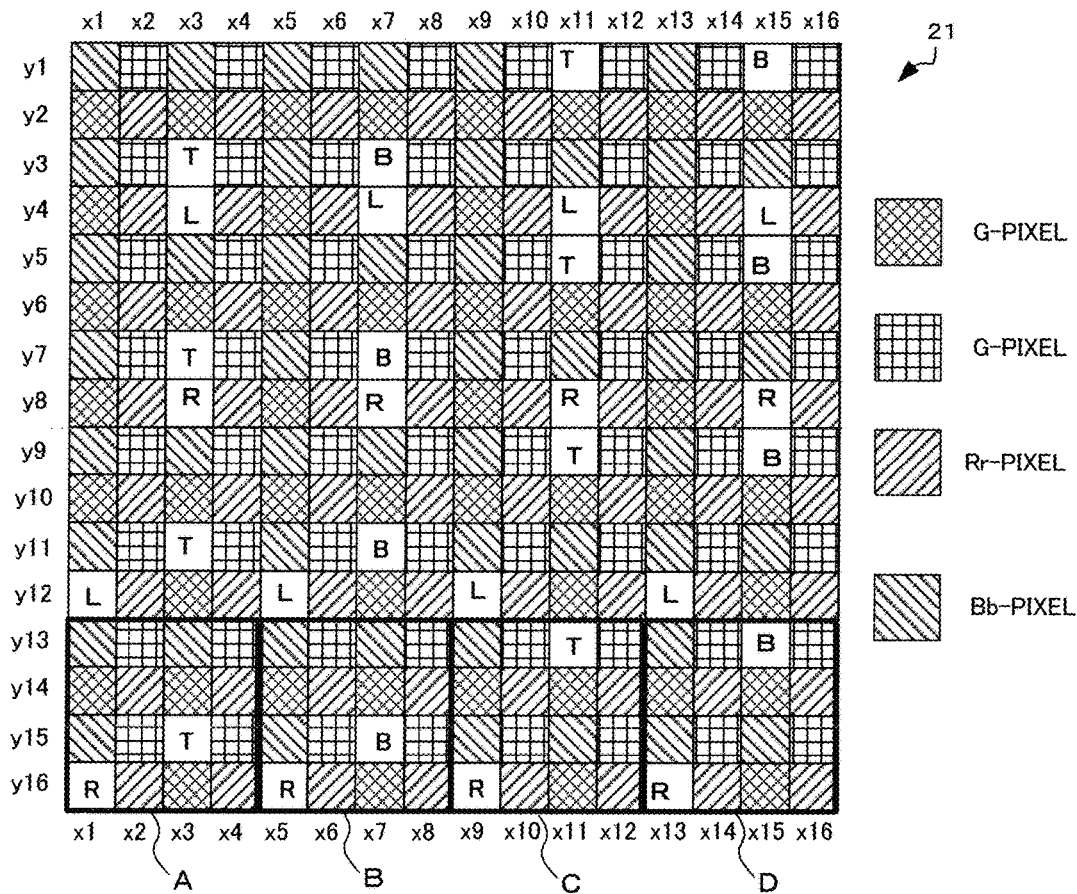
FIGS. 6A to 6E are diagrams explaining mixing readout in an image sensor according to an embodiment of the present invention.

The example shown in FIGS. 6A to 6E illustrates a pixel arrangement and mixed pixel blocks for explaining pixel mixing in pixel mixing readout. Here, while the pixel arrangement shown in FIG. 6A is substantially the same as the pixel arrangement shown in FIG. 3A, the coordinate system is changed for the convenience of explanation. The correspondence of the coordinates between FIG. 6A and FIG. 3A is as follows. When the correspondence from FIG. 6A to FIG. 3A) is expressed by →, the correspondences are (x1, y1)→(x1, y16), (x1, y16)→(x1, y1), (x8, y1)→(x8, y16), and (x8, y16)→(x8, y1). The four pixel mixing readout is a pixel line readout method of mixing total four pixels of two same color pixels in the horizontal direction for two neighboring same color lines in the vertical direction. Note that the example shown in FIGS. 6A to 6E illustrates a case of reading out the lines (pixels) on the bottom side of the drawing.

FIG. 6A shows a pixel arrangement of a partial region in the image sensor 21 for explaining the four pixel mixing readout. When the pixels of the image sensor 21 are divided into areas A, B, C, and D as shown in FIG. 6A, in each of the areas, the arrangement of the RL-pixels and the TB-pixels is different from the arrangement of the normal image sensor not including the focus detecting pixels.

Figure 6B:
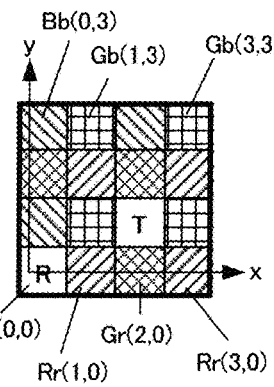

FIG. 6B is an enlarged view of the area A in FIG. 6A (rectangular range surrounded by positions (x1, y13), (x4, y13), (x1, y16), and (x4, y16)). In the case of performing the four pixel mixing readout, the data of each of RGB-pixels (red, green, or blue pixels in the case of the Bayer arrangement) in the pixels of this range (pixel block) is obtained from following formulas (1) to (4).

Here, as shown in FIG. 6B, coordinates in each of the areas are expressed as follows; the lower left corner pixel position is designated by Gr (0, 0), the pixel positions toward the right side in the horizontal direction are designated by Rr (1, 0), Gr (2, 0), and Rr (3, 0) in this order, and the top pixel position in the vertical direction is designated by Bb (0, 3). Note that this coordinate determination method is used also in FIGS. 6C, 6D, and 6E.

$$Gr\_mix1=\{Gr(0,0)+Gr(2,0)+Gr(0,2)+Gr(2,2)\}/4 \quad (1)$$

$$Rr\_mix1=\{Rr(1,0)+Rr(3,0)+Rr(1,2)+Rr(3,2)\}/4 \quad (2)$$

$$Gb\_mix1=\{Gb(1,1)+Gb(3,1)+Gb(1,3)+Gb(3,3)\}/4 \quad (3)$$

$$Bb\_mix1=\{Bb(0,1)+Bb(0,3)+Bb(2,3)\}/3 \quad (4)$$

As apparent from FIG. 6B, for Gr mixed pixels (green mixed pixels), Gb mixed pixels (green mixed pixels), and Rr mixed pixels (red mixed pixels), the pixel data sets of four same color pixels in the area A are added and divided by four to calculate the mixed value (refer to formulas (1) to (3)). In this case, as shown in formula (1), for obtaining the Gr mixed pixel data, the R-pixel (position Gr(0, 0)) is also included in the addition. On the other hand, as shown in formula (4), for the Bb mixed pixels (blue mixed pixels), the pixel data sets of the three same color pixels in the area A are added, and the T-pixel at Bb(2, 1) is not included in the addition, and the mixed value is calculated by the use of only the other three same color pixels.

Figure 6C:
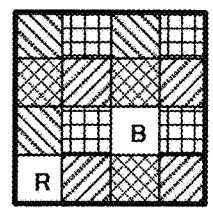

FIG. 6C is an enlarged view of the area B in FIG. 6A (rectangular range surrounded by positions (x5, y13), (x8, y13), (x5, y16), and (x8, y16)). When the mixing readout is performed for the pixels in this range, the data of each of the RGB-pixels (red, green, or blue pixels in the case of the Bayer arrangement) is obtained from following formulas (5) to (8).

$$Gr\_mix2=\{Gr(0,0)+Gr(2,0)+Gr(0,2)+Gr(2,2)\}/4 \quad (5)$$

$$Rr\_mix2=\{Rr(1,0)+Rr(3,0)+Rr(1,2)+Rr(3,2)\}/4 \quad (6)$$

$$Gb\_mix2=\{Gb(1,1)+Gb(3,1)+Gb(1,3)+Gb(3,3)\}/4 \quad (7)$$

$$Bb\_mix2=\{Bb(0,1)+Bb(0,3)+Bb(2,3)\}/3 \quad (8)$$

Figure 6D:
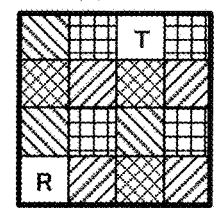

FIG. 6D is an enlarged view of the area C in FIG. 6A (rectangular range surrounded by positions (x9, y13), (x12, y13), (x9, y16), and (x12 y16)). When the mixing readout is performed for the pixels in this range, the data of each of the RGB-pixels (red, green, or blue pixels in the case of the Bayer arrangement) is obtained from following formulas (9) to (12).

$$Gr\_mix3=\{Gr(0,0)+Gr(2,0)+Gr(0,2)+Gr(2,2)\}/4 \quad (9)$$

$$Rr\_mix3=\{Rr(1,0)+Rr(3,0)+Rr(1,2)+Rr(3,2)\}/4 \quad (10)$$

$$Gb\_mix3=\{Gb(1,1)+Gb(3,1)+Gb(1,3)+Gb(3,3)\}/4 \quad (11)$$

$$Bb\_mix3=\{Bb(0,1)+Bb(0,3)+Bb(2,1)\}/3 \quad (12)$$

Figure 6E:
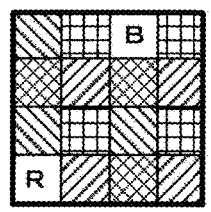

FIG. 6E is an enlarged view of the area D in FIG. 6A (rectangular range surrounded by positions (x13, y13), (x16, y13), (x13, y16), and (x16 y16)). When the mixing readout is performed for the pixels in this range, the data of each of the RGB-pixels (red, green, or blue pixels in the case of the Bayer arrangement) is obtained from following formulas (13) to (16).

$$Gr\_mix4=\{Gr(0,0)+Gr(2,0)+Gr(0,2)+Gr(2,2)\}/4 \quad (13)$$

$$Rr\_mix4=\{Rr(1,0)+Rr(3,0)+Rr(1,2)+Rr(3,2)\}/4 \quad (14)$$

$$Gb\_mix4=\{Gb(1,1)+Gb(3,1)+Gb(1,3)+Gb(3,3)\}/4 \quad (15)$$

$$Bb\_mix4=\{Bb(0,1)+Bb(0,3)+Bb(2,1)\}/3 \quad (16)$$

The case of FIGS. 6C to 6E are also the same as the case of FIG. 6B, and, for each of the Gr mixed pixels (green mixed pixels), the Gb mixed pixels (green mixed pixels), and the Rr mixed pixels (red mixed pixels), the pixel data sets of four same color pixels in each of the areas B to D are added and divided by four to calculate the mixed value. In this case, for obtaining the Gr mixed pixel data, the R-pixel (position Gr(0, 0)) is also included in the addition (refer to formulas (5), (9), and (13)). On the other hand, for the Bb mixed pixels (blue mixed pixels), the pixel data sets of the three same color pixels in the area B are added, and the B-pixel at Bb(2, 1) is not included in the addition and the mixed value is calculated by the use of only the other three same color pixels (refer to formula (8)). Further, in the area C or D, for the Bb mixed pixels (blue mixed pixels), the pixel data sets of the three same color pixels are added, and the T-pixel or the B-pixel at Bb(2, 3) is not included in the addition and the mixed value is calculated by the use of only the other three same color pixels (refer to formulas (12) and (16)).

Figure 7A:
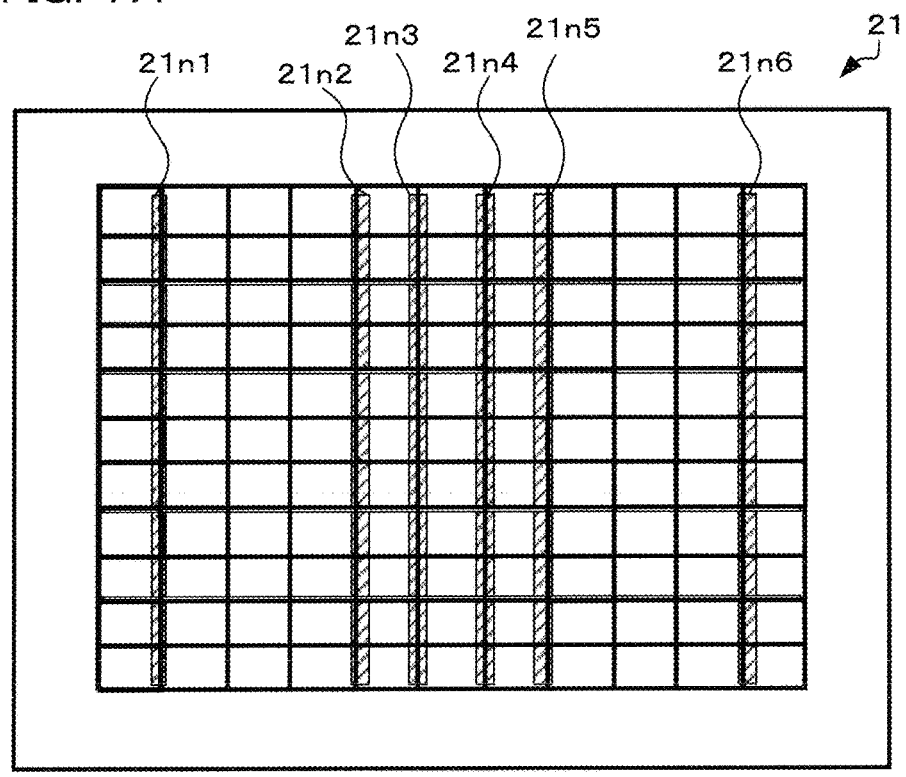
FIGS. 7A and 7B are diagrams showing an arrangement of focus detecting pixels for a largely-defocused state in an image sensor according to an embodiment of the present invention.
Figure 7B:
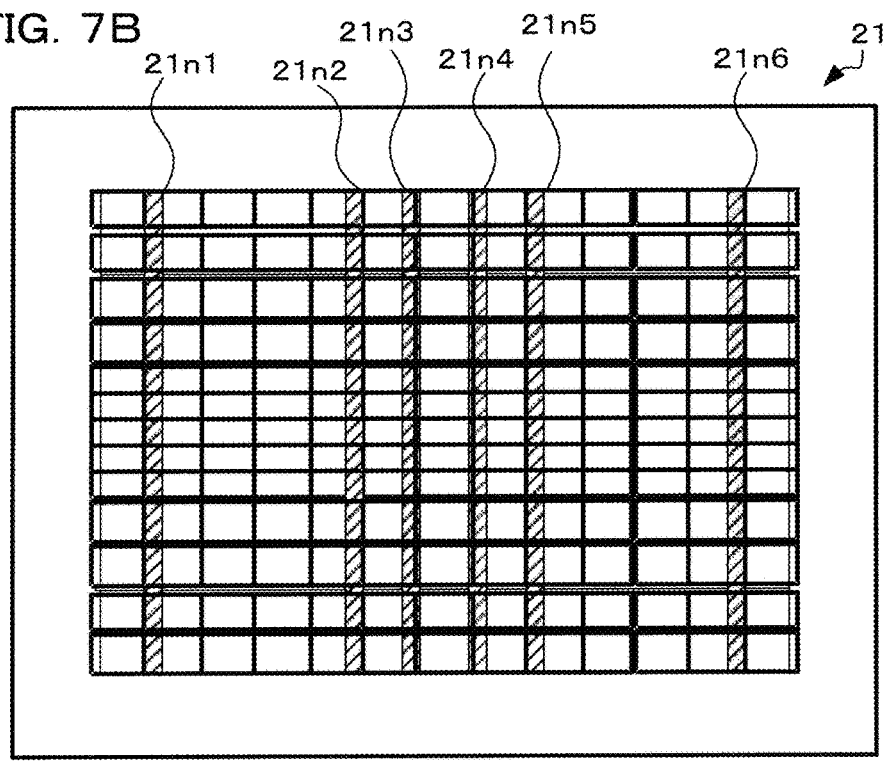

Next, by the use of FIGS. 7A and 7B, an arrangement of the AF range-finding areas and the focus detecting pixels for the largely-defocused state will be explained. In FIGS. 7A and 7B, each of the rectangular parts is an AF range-finding area, and FIG. 7A shows a case in which the AF range-finding areas are divided into 11×11 from an area (1, 1) to an area (11, 11) with respect to the reference of top left of 21$m$ (FIG. 3E), and FIG. 7B shows a case in which the AF range-finding areas are divided into 13×13 from an area (1, 1) to an area (13, 13).

Also in the example shown in FIG. 7A in which the AF range-finding areas are divided into 11×11, and also in the example shown in FIG. 7B in which the AF range-finding areas are divided into 13×13, the focus detecting pixels for the largely-defocused state (T2-pixels and B2-pixels) are arranged in the regions 21$n$1 to 21$n$6 extending in the vertical direction. As apparent from FIGS. 7A and 7B, each of these regions 21$n$1 to 21$n$6 is located near the boundary of the AF range-finding area.

While each of the normal focus detecting pixels (T-pixels and B-pixels) is designed so as to have a high accuracy near the focusing point, each of the focus detecting pixels for the largely-defocused state (T2-pixels and B2-pixels) not always has a sufficiently high detection accuracy near the focusing point. Accordingly, preferably the normal focus detecting pixels are arranged in the AF range-finding area as much as possible. On the other hand, since it is enough for the focus detecting pixels for the largely-defocused state to be able to approximately detect the defocus amount and the defocus direction, it is enough for them to be arranged in the gap or near the boundary between the AF range-finding areas. On the other hand, the dividing of the AF range-finding areas is performed optionally according to the design concept of a digital camera. That is, the dividing is performed according to various design concepts, such as dividing the AF range-finding areas finely or broadly.

Accordingly, in the present embodiment, even when the dividing of the AF range-finding area is different depending on the type of a camera such as dividing into 11×11 or 13×13, most of the focus detecting pixels for the largely-defocused state (T2-pixels and B2-pixels) are arranged at positions in the gaps or near the boundaries between the AF range-finding areas. In this case, since normally the AF range-finding areas are arranged densely near the center of the imaging plane, the arrangement of the regions 21$n$2 to 21$n$5 where the focus detecting pixels for the largely-defocused state are arranged is made dense also near the center of the imaging plane and sparse in the peripheral part. This is because the AF areas and the focus detecting pixels for the large defocus detection (T2-pixels and B2-pixels) have appropriate positional relationships in either AF area arrangement of the AF arrangements of 11×11 (FIG. 7A) and 13×13 (FIG. 7B), for example.

Since generally AF area arrangement is determined with respect to the reference of the screen center, if the size difference between the AF areas of the different arrangements is small to some extent near the screen center, the position shift is small between the AF area boundary and the T2-pixel or the B2-pixel. For example, in the case of the two kinds of AF area arrangements of FIGS. 7A and 7B, even when a common arrangement is used for both of the T2-pixels and the B2-pixels, the position shift between the boundary of the AF area on the lateral side and the T2-pixel or the B2-pixel is small and an appropriate positional relationship is obtained in 21$n$2 to 21$n$5. Between 21$n$1 and 21$n$2 and between 21$n$5 and 21$n$6, however, the shift of the lateral boundary of the AF area is increased by the size difference of the AF area between the different AF area arrangements.

Accordingly, when the T2-pixles and the B2-pixels are arranged according to one of the AF area arrangements, in the other one of the AF area arrangements, the T2-pixels and the B2-pixels are located near the centers inside the AF areas between 21$n$1 and 21$n$2 and between 21$n$5 and 21$n$6. Then, there arise a problem that the AF accuracy is degraded in the AF areas located between 21$n$1 and 21$n$2 and between 21$n$5 and 21$n$6. For solving the problem like this, the T2-pixels and the B2-pixels are not to be arranged between 21$n$1 and 21$n$2 and between 21$n$5 and 21$n$6 of FIGS. 7A and 7B. Further, the T2-pixels and the B2-pixels are pixels for the large defocus detection and thus it is not effective to arrange the T2-pixels and the B2-pixels densely across the entire screen.

In this manner, in the present embodiment, the T-pixels and the B-pixels of the focus detecting pixels are arranged at positions for the Bb-pixels of the normal image sensor not including the focus detecting pixels, the T2-pixels and B2-pixels for the large defocus detection are arranged at positions of these T-pixels and the B-pixels. Since in the mixing readout, readout is performed while skipping the focus detecting pixels arranged at positions of the Bb-pixels and the Rr-pixels other than the G-pixels, as explained by the use of FIG. 6A, the change of the light shielding ratio does not matter. Accordingly, the light shielding ratio is made different between the focus detecting pixels arranged at the positions of the Bb-pixels and the Rr-pixels, and the defocus amount and the defocus direction are made detectable even in the largely-defocused state.

Figure 8:
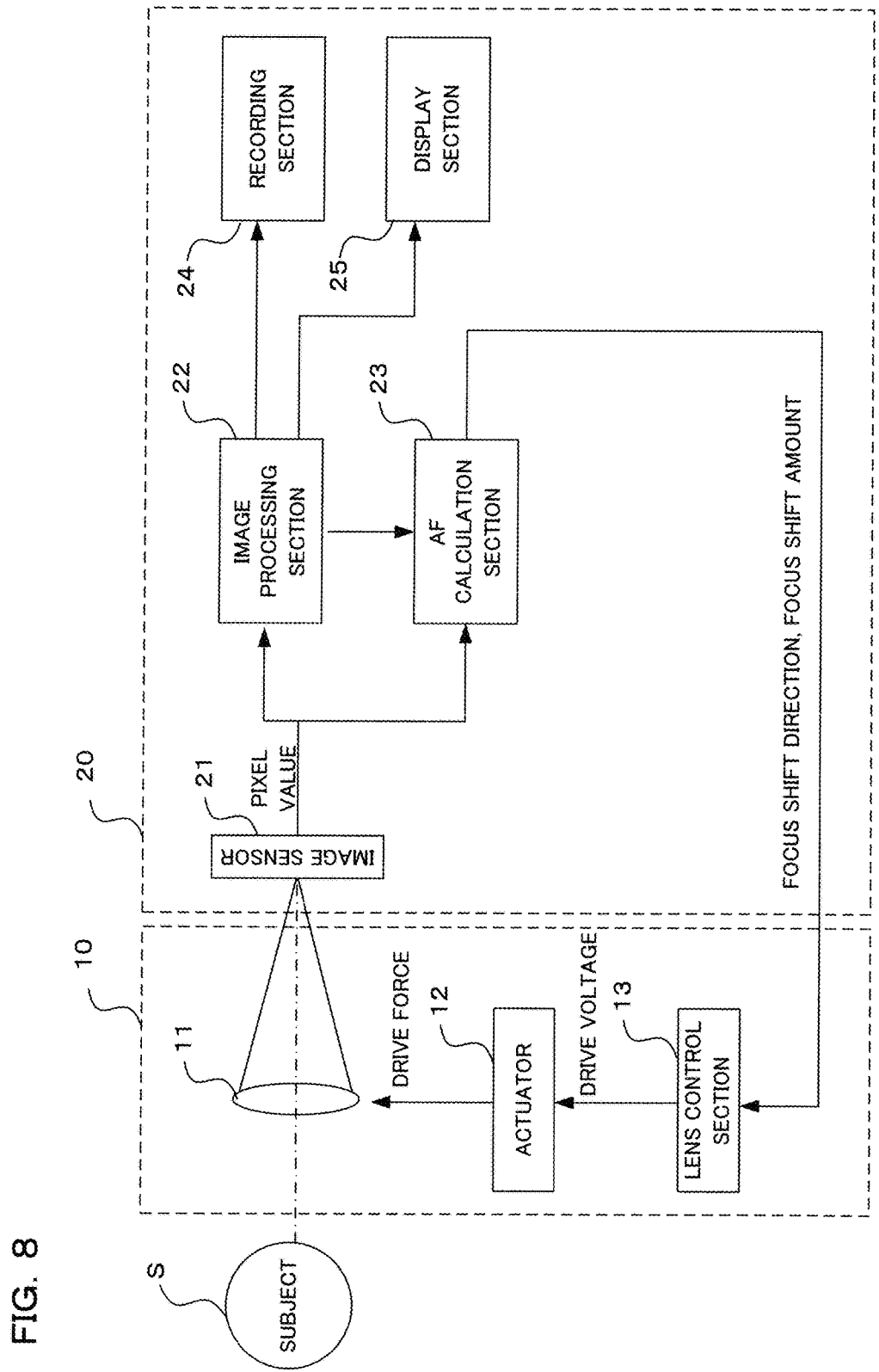
FIG. 8 is a block diagram mainly showing an electric configuration of a digital camera to which an image sensor according to an embodiment of the present invention is applied.

Next, by the use of FIG. 8, a digital camera mounting the image sensor 21 according to the present embodiment will be explained. FIG. 8 is a block diagram mainly showing an electric configuration of a camera according to an embodiment of the present invention. The camera according to the present embodiment includes an interchangeable lens barrel 10 and a camera main body 20. The interchangeable lens barrel 10 and the camera main body 20, while configured separately in the present embodiment, obviously may be configured in a unit as in a typical compact camera.

A photographing lens 11 is disposed inside the interchangeable lens barrel 10. The photographing lens 11 includes a plurality of optical lenses for forming an optical image of a subject S. Further, an actuator 12 and a lens control section 13 are provided inside the interchangeable lens barrel 10. The lens control section 13 receives the focus shift direction and the focus shift amount from an AF calculation section 23 inside the camera main body 20, and performs the control of the actuator 12 according to this information. The actuator 12 moves the photographing lens 11 in the optical axis direction to perform focusing.

An image sensor 21, an image processing section 22, the AF calculation section 23, a recording section 24, and a display section 25 are provided inside the camera main body 20. Here, a CPU (Central Processor Unit) is provided inside the image processing section 22 or the AF calculation section 23 in addition to a hardware circuit, and a part of the processing of the image processing section 22 and the AF calculation section 23 is carried out by software.

The image sensor 21 is disposed on the optical axis of the photographing lens 11 near the image forming position of a subject image. The image sensor 21 includes a plurality of pixels each having a photoelectric conversion section to convert the subject image (optical image) into an electric signal. That is, in the image sensor 21, photodiodes configuring the respective pixels are arranged in a matrix two-dimensionally, each of the photodiodes generates photoelectric conversion current according to a light reception amount, and this photoelectric conversion current is accumulated as an electric charge in a capacitor connected to each of the photodiodes. RGB filters in the Bayer arrangement are arranged on the front face of each of the pixels. The plurality of photodiodes corresponds to the above plurality of pixels.

Further, the plurality of pixels of the image sensor 21 includes the focus detecting pixels (RL-pixels, TB-pixels, T2-pixels, and B2-pixels) each of which is configured so as to restrict the incident direction of a light flux entering the pixel and the imaging pixels each of which is configured so as not to restrict a light flux entering the pixel more than the focus detecting pixels as explained by the use of FIG. 1 to FIGS. 7A and 7B. The image sensor 21 outputs the pixel value output from the focus detecting pixels and the imaging pixels to the image processing section 22 and the AF calculation section 23.

The image processing section 22 inputs mixed pixel values from the imaging pixels and the focus detecting pixels (note that the TB-pixels, the T2-pixels, and the B2-pixels are not included and only the RL-pixels are included), and performs image processing for a live-view display image and a moving picture recording image. Further, the image processing section 22 inputs pixel values from the imaging pixels and the focus detecting pixels, and performs image processing for still image recording. In addition, the image processing section 22 outputs image data processed for recording to the recording section 24, and outputs image data image-processed for live-view display to the display section 25.

The recording section 24 includes an electrically-rewritable nonvolatile memory, and inputs the image data for recording and records the data. The display section 25 inputs the image data for live-view display or image data for reproduction, and performs the display of the live-view image or a reproduction image on a display panel of LCD, organic EL or the like according to the image data.

The AF calculation section 23 inputs the pixel values of the focus detecting pixels (RL-pixels, TB-pixels, T2-pixels, and B2-pixels) out of the pixel values, and calculates the focus shift direction and the focus shift amount by the phase difference AF method.

Note that, for the mixing of the pixel values, the pixel mixing may be performed in the readout from the image sensor 21, or the pixel mixing may be performed by digital calculation in the image processing section 22 or the AF calculation section 23 by the use of the pixel values read out from the image sensor 21.

The present embodiment provides a function of a pixel mixing readout section in which any of the image sensor 21, the image processing section 22, the AF calculation section 23 and the like or any of the sections in cooperation mixes and reads out the pixel signals. When mixing and reading out the outputs of the imaging pixels corresponding to the first color filters (when mixing and reading out the Bb-pixels or the Rr-pixels, for example), this pixel mixing readout section performs the readout so as not to mix the outputs of the first focus detecting pixels (T-pixel and B-pixel, for example) and the outputs of the second focus detecting pixels (T2-pixels and B2-pixels, for example) (refer to FIG. 3, FIG. 4A, and FIG. 4B, for example).

Further, in the present embodiment, the function of a focus detection region setting section to set a focus detection region in the photographing screen is provided for the AF calculation section 23 or the like. For the focus detection region setting section, a photographer may set the focus detection region (refer to the AF range-finding region of FIGS. 7A and 7B) manually via an operation section, or a region where a nearest subject exists, a person's face, or the like may be set automatically as the focus detection region.

Next, by the use of a flowchart shown in FIG. 9, the operation of the camera will be explained. This flowchart is carried out by a control section such as a CPU (Central Processor Unit) provided inside the image processing section 22 or the AF calculation section 23 to control each section inside the camera according to a program stored in a nonvolatile memory (un-illustrated) provided inside the camera main body 20.

Figure 9:
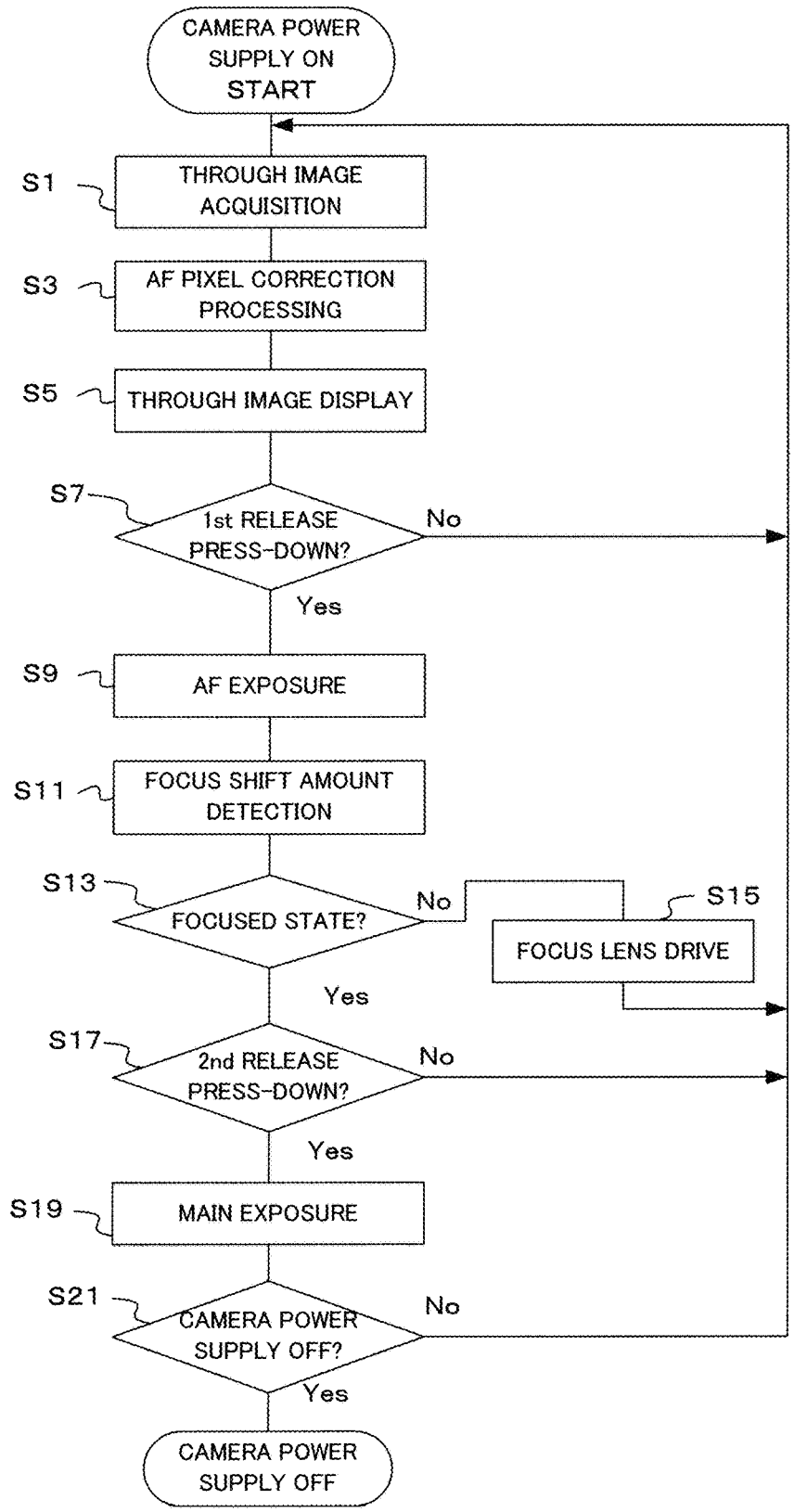
FIG. 9 is a flowchart showing an operation of a digital camera to which an image sensor according to an embodiment of the present invention is applied.

When the camera is powered on, the flowchart shown in FIG. 9 is started. When the flowchart is started, first, the acquiring of a through image (live-view display image data) is performed (S1). Here, as explained by the use of FIG. 6, the mixing readout is performed for the normal imaging pixels and the focus detecting pixels (except the TB-pixels, the T2-pixels, and the B2-pixels) in the image sensor 21.

After the acquisition of the through image, next, the AF pixel correction processing is performed (S3). Here, the correction processing is performed for the RL-pixels of the focus detecting pixels in the focus detection regions. That is, the focus detecting pixel has a smaller pixel value because of the restricted opening. The correction is performed so as to cause the focus detecting pixel to have approximately the same level of the pixel value as the normal imaging pixel. Since the output value of the RL-pixel of the focus detecting pixel is included in the pixel mixing output value of the G-pixels, the correction processing is performed by the use of the mixed pixel output value of the un-illustrated G-pixels not including the RL-pixels, correction data based on an image height position according to the optical characteristics of the photographing lens 11, or the like.

After the AF pixel correction processing, next, the through image display (live-view display) is performed (S5). Here, the image processing section 22 performs the through image display on the display section 25 using the image data read out in step S1 and corrected in step S3.

After the through image display, next, it is determined whether or not first release press-down is performed (S7). Here, it is determined whether or not release button half press-down operation, that is, the first release press-down is performed, based on the state of a switch which is turned on or off by the release button half press-down operation. When the first release press-down is not performed as this determination result, the process returns to step S1.

On the other hand, when the first release press-down is performed as the determination result in step S7, AF exposure is performed (S9). Here, exposure control is performed so as to obtain appropriate exposure for the focus detecting pixels in the focus detection regions (RL-pixels, TB-pixels, T2-pixels, and B2-pixels), and the addition values of the pixel values in the RL-pixels, the TB-pixels, the T2-pixels, and the B2-pixels (refer to FIG. 1) are read out from the image sensor 21.

After the AF exposure, next, focus shift amount detection is performed (S11). Here, the focus shift direction (defocus direction) and the focus shift amount (defocus amount) of the photographing lens 11 are calculated by the use of the addition values of the pixel values of the focus detecting pixels (RL-pixels and TB-pixels) in the focus detection regions (addition value of outputs of the R-pixels in Rsumarea and addition value of outputs of the L-pixels in Lsumarea). Here, in the case of the large defocus, first, the focus shift direction (defocus direction) and the focus shift amount (defocus amount) are calculated approximately by the use of the focus detecting pixels for the large defocus (T2-pixels and B2-pixels).

After the focus shift amount detection, next, it is determined whether or not a focused state is obtained (S13). Here, the determination is performed depending on whether or not the focus shift amount calculated in step S11 falls within a predetermined range (range of an assumed focused state).

When the focused state is not obtained as the determination result in step S13, focus lens drive is performed (S15). Here, the lens control section 13 moves the photographing lens 11 to a focusing position via the actuator 12 according to the focus shift amount and the focus shift direction calculated in step S11. After the focus lens drive, the process returns to step S1.

When the focused state is obtained as the determination resulting step S13, it is determined whether or not second release press-down is performed (S17). A photographer observes the through image and performs release button full press-down when having determined a shutter chance, that is, performs second release press-down. Therefore, in this step, the determination is performed based on the state of a switch which is turned on or off by the release button full press-down operation. When the second release press-down is not performed as this determination result, the process returns to step S1.

When the second release press-down is performed as the determination result in step S17, main exposure is performed (S19). Here, exposure operation is performed by the image sensor 21 according to a preliminarily determined exposure control value. After the finish of this exposure, the pixel values of all the pixels (normal imaging pixels and focus detecting pixels) are read out from the image sensor 21, and the image processing section 22 generates the image data of a still image. In the generation of this image data, the pixel values from the focus detecting pixels are corrected. When the image data is generated, the image data is recorded in the recording section 24.

After the finish of the main exposure, next, it is determined whether the camera is powered on or off (S21). Here, the determination is performed based on the state of a camera power supply switch. When the power supply is not to be turned off as this determination result, the process returns to step S1. On the other hand, when the power supply is to be turned off, the power supply becomes the off state after finish processing.

As explained above, the image sensor 21 in an embodiment of the present invention includes the plurality of imaging pixels, the plurality of focus detecting pixels which have the opening positions of the light receiving sections shifted from those of the imaging pixels (RL-pixels, TB-pixels, T2-pixels, and B2-pixels), and the plurality of color filters arranged corresponding to the imaging pixels and the focus detecting pixels. Further, in this image sensor 21, the first focus detecting pixels (TB-pixels, for example) which have the opening positions shifted in the first direction (longitudinal direction in FIGS. 3A and 3C, for example) are arranged at positions corresponding to the first color filters for the imaging pixels (blue filters or red filters, for example), and the second focus detecting pixels which have the opening positions shifted in the first direction and also have opening ratios different from those of the first focus detecting pixels (T2-pixels and B2-pixels, for example) are arranged at positions corresponding to the first color filters. Accordingly, it is possible to ensure the image quality performance and to perform the focus detection quickly even in the largely-defocused state. That is, since the focus detecting pixels are arranged at positions corresponding to the first color filters, it is possible to ensure the image quality performance, and, since the second focus detecting pixels having the opening ratios different from those of the first focus detecting pixels are arranged, it is possible to perform the focus detection quickly even in the largely-defocused state.

Further, in an embodiment of the present invention, the opening ratio of the second focus detecting pixel (T2-pixel or B2-pixel) is smaller than the opening ratio of the first focus detecting pixel (TB-pixel) (refer to FIGS. 3B and 3D, for example). Accordingly, it is possible to detect the defocus amount easily even in the largely-defocused state using the second focus detecting pixels.

Furthermore, in an embodiment of the present invention, the second focus detecting pixels (T2-pixels and B2-pixels) are arranged in a line shape at a predetermined pixel pitch (refer to FIG. 3C, FIG. 5, and the like, for example). Accordingly, in the readout of the pixels, it is possible to read out the second focus detecting pixels as the other focus detecting pixels without performing special processing.

Moreover, in an embodiment of the present invention, third focus detecting pixels (RL-pixels, for example) in which the opening positions are shifted in the second direction (lateral direction in FIGS. 3A and 3C, for example) perpendicular to the first direction (longitudinal direction in FIGS. 3A and 3C, for example) are arranged at positions corresponding to the second color filters for the imaging pixels (green filter, for example) different from the first color filters. Accordingly, it is possible to perform focusing also for a subject for which the defocus amount is easily detected in the second direction.

In addition, in an embodiment of the present invention, the first color filter is blue or red. In the present embodiment, since the first and second focus detecting pixels are arranged at the positions of the blue filters or the red filters and these color filters exhibit low human visibilities and hardly provide effects for the image quality, it is possible to ensure an image quality also when the focus detecting pixels are arranged at these positions.

Additionally, in an embodiment of the present invention, in the image sensor 21, the first focus detecting pixels (TB-pixels, for example) which have the opening positions shifted in the first direction are arranged at positions corresponding to the first color filters for the imaging pixels (blue filters and red filters, for example), the second focus detecting pixels which have the opening positions shifted in the first direction and also have opening ratios different from those of the first focus detecting pixels (T2-pixels and B2-pixels, for example) are arranged at positions corresponding to the first color filters, and the second focus detecting pixels are not arranged in a region of the image sensor corresponding to the focus detection region (refer to FIGS. 7A and 7B, for example). Accordingly, it is possible to arrange the first focus detecting pixels having a high accuracy near the focusing point, in the focus detection region.

Further, in an embodiment of the present invention, in the image sensor 21, the second focus detecting pixels are arranged in a higher density in the center part than in the peripheral part within the imaging screen (refer to FIGS. 7A and 7B, for example). Since many focus detection regions are set in the center part, it is possible to perform range-finding depending on the set focus detection region by employing the configuration like this.

Note that, while the pixel pitch is a four pixel pitch in the image sensor according to an embodiment of the present invention, the present invention is not limited to this case. Further, while the pixels are arranged along two directions perpendicular to each other, the present invention is not limited to this case. In addition, the RGB-pixel positions where the RL-pixels, the TB-pixels, T2-pixels and B2-pixels are to be arranged are not limited to the illustrated example.

Further, while an embodiment of the present invention has been explained by the use of the digital camera as equipment for photographing, the camera may be a digital single-reflex camera, a compact digital camera, a motion picture camera such as a video camera and a movie camera, and further a camera built in a mobile phone, a smartphone, a mobile information terminal (PDA: Personal Digital Assist), a personal computer (PC), a tablet-type computer, or a game machine. In any case, the camera may be any equipment if an image sensor is built in.

Furthermore, while the present embodiment has been explained by the use of the digital camera as equipment for photographing, the camera may be a digital single-reflex camera, a compact digital camera, a motion picture camera such as a video camera and a movie camera, and further a camera built in a mobile phone, a smartphone, a mobile information terminal (PDA: Personal Digital Assist), a personal computer (PC), a tablet-type computer, or a game machine. In any case, the present invention can be applied to an image sensor including focus detecting pixels for performing focus detection by the phase difference method in a part of the image sensor and can be applied to equipment including this image sensor.

Moreover, in the technique explained in the present specification, the control mainly explained in the flowchart can be frequently set by a program and sometimes stored in a recording medium or the recording section. This recording to the recording medium or the recording section may be performed in product shipment, may be performed using a distributed recording medium, or may be performed by download via the Internet.

In addition, for claims, specification, and the operation flow in the drawing, the explanation using a word expressing order such as "first" and "next" for convenience does not mean that performing in this order is essential, in apart without explanation in particular.

As understood by those having ordinary skill in the art, as used in this application, 'section,' 'unit,' 'component,' 'element,' 'module,' 'device,' 'member,' 'mechanism,' 'apparatus,' 'machine,' or 'system' may be implemented as circuitry, such as integrated circuits, application specific circuits ("ASICs"), field programmable logic arrays ("FPLAs"), etc., and/or software implemented on a processor, such as a microprocessor.

The present invention is not limited to the above embodiment as it is, and can be implemented in the practice stage by modification of the structural element in the range without departing from the scope thereof. Further, various inventions can be formed by appropriate combinations of a plurality of structural elements disclosed in the above embodiment. For example, some structural elements can be eliminated from all the structural elements shown in the embodiment. Further, the structural elements across the different embodiments may be combined appropriately.

What is claimed is:

1. An imaging device, comprising:
    an image sensor having a plurality of imaging pixels, a plurality of focus detecting pixels in which opening positions of light receiving sections are shifted from those of the imaging pixels, and a plurality of color filters arranged corresponding to the imaging pixels and the focus detecting pixels; and
    a readout section configured to read out pixel signals being output from the image sensor, wherein
    the image sensor arranges first focus detecting pixels at positions corresponding to first color filters of the imaging pixels, and arranges second focus detecting pixels at positions corresponding to second color filters different from the first color filters, and
    the readout section mixes a plurality of pixel signals having included therein outputs of the first focus detecting pixels and reads out first mixed pixel outputs, when mixing and reading out outputs of the imaging pixels corresponding to the first color filters, and mixes a plurality of pixel signals without having included therein outputs of the second focus detecting pixels and reads out second mixed pixel outputs, when mixing and reading out outputs of the imaging pixels corresponding to the second color filters.

2. The imaging device according to claim 1, wherein opening positions of the first focus detecting pixels are shifted in a first direction, and opening positions of the second focus detecting pixels are shifted in a second direction which is different from the first direction.

3. The imaging device according to claim 1, wherein a part of the second focus detecting pixels has an opening position shifted in the second direction, and a different light shielding ratio.

4. The imaging device according to claim 1, wherein the first color filter is green and the second color filter is blue or red.

5. The imaging device according to claim 1, wherein the color filter arranged on the first and the second focus detecting pixels is the first color filter.

6. The imaging device according to claim 1, further comprising:
    an image processing section configured to generate image data for moving image recording, wherein
    the readout section, when recording a moving image, reads out the first mixed pixel outputs and reads out the second mixed pixel outputs, and
    the image processing section generates image data for moving image recording on the basis of the first mixed pixel outputs and the second mixed pixel outputs.

7. The imaging device according to claim 1, further comprising:
    a display section configured to perform display based on image data captured by the image sensor; and
    an image processing section configured to generate image data to be displayed on the display section, wherein
    the readout section, when display is performed by the display section, reads out the first mixed pixel outputs and reads out the second mixed pixel outputs, and
    the image processing section generates the image data to be displayed on the basis of the first mixed pixel outputs and the second mixed pixel outputs.

8. A method of controlling an image sensor having a plurality of imaging pixels and being configured to arrange first focus detecting pixels at positions corresponding to first color filters of the imaging pixels, and arrange second focus detecting pixels at positions corresponding to second color filters different from the first color filters, the method comprising the steps of:
    mixing a plurality of pixel signals having included therein outputs of the first focus detecting pixels and reading out first mixed pixel outputs, when mixing and reading out outputs of the imaging pixels corresponding to the first color filters, and mixing a plurality of pixel signals without having included therein outputs of the second focus detecting pixels and reading out second mixed pixel outputs, when mixing and reading out outputs of the imaging pixels corresponding to the second color filters.

9. The control method according to claim 8, further comprising:

an image processing step for generating image data for moving image recording, wherein the reading out step reads out the first mixed pixel outputs and reads out the second mixed pixel outputs, and the image processing step generates image data for moving image recording on the basis of the first mixed pixel outputs and the second mixed pixel outputs.

10. The control method according to claim 8, further comprising:

an image processing step for generating image data to be displayed, wherein the reading out step reads out the first mixed pixel outputs and reads out the second mixed pixel outputs, and the image processing step generates image data to be displayed on the basis of the first mixed pixel outputs and the second mixed pixel outputs.

* * * * *